(12) United States Patent
Matsumoto et al.

(10) Patent No.: US 7,408,287 B2
(45) Date of Patent: Aug. 5, 2008

(54) FILM BULK ACOUSTIC WAVE RESONATOR, FILM BULK ACOUSTIC WAVE RESONATOR FILTER AND METHOD OF MANUFACTURING FILM BULK ACOUSTIC WAVE RESONATOR

(75) Inventors: Hisanori Matsumoto, Kokubunji (JP); Kengo Asai, Hachioji (JP); Atsushi Isobe, Kodaira (JP); Mitsutaka Hikita, Hachioji (JP)

(73) Assignee: Hitachi Media Electronics Co., Ltd., Iwate (JP)

( * ) Notice: Subject to any disclaimer, the term of this patent is extended or adjusted under 35 U.S.C. 154(b) by 0 days.

(21) Appl. No.: 11/602,330

(22) Filed: Nov. 21, 2006

(65) Prior Publication Data

US 2007/0069606 A1 Mar. 29, 2007

Related U.S. Application Data

(62) Division of application No. 10/909,335, filed on Aug. 3, 2004.

(30) Foreign Application Priority Data

Feb. 4, 2004 (JP) ......................... 2004-027590 U

(51) Int. Cl.
    *H01L 41/083* (2006.01)
(52) U.S. Cl. ...................... 310/320; 310/324
(58) Field of Classification Search ............... 310/320, 310/324
    See application file for complete search history.

(56) References Cited

U.S. PATENT DOCUMENTS

| | | | |
|---|---|---|---|
| 5,873,153 A | 2/1999 | Ruby et al. ............. | 29/25.35 |
| 6,469,597 B2 | 10/2002 | Ruby et al. ............. | 333/187 |
| 6,483,229 B2 | 11/2002 | Larson et al. ........... | 310/348 |
| 6,617,249 B2 | 9/2003 | Ruby et al. ............. | 438/689 |
| 6,992,420 B2 | 1/2006 | Jang et al. ............. | 310/324 |
| 2002/0089393 A1* | 7/2002 | Tikka et al. ............ | 333/133 |
| 2003/0218518 A1* | 11/2003 | Lee ...................... | 333/189 |
| 2004/0012463 A1* | 1/2004 | Kawakubo et al. ....... | 333/187 |
| 2004/0135144 A1* | 7/2004 | Yamada et al. ......... | 257/59 |

FOREIGN PATENT DOCUMENTS

| JP | 2002-299979 | 10/2002 |
|---|---|---|
| JP | 2002-299980 | 10/2002 |
| JP | 2002-335141 | 11/2002 |

OTHER PUBLICATIONS

Ruby et al., "Micromachined Thin Film Bulk Acoustic Resonators," 1994 IEEE International Frequency Control Symposium, pp. 135-138.
Nishihara et al., "High Performance and Miniature Thin Film Bulk Acoustic Wave Filters for 5 GHz," 2002 IEEE Ultrasonic Symposium, pp. 969-972.

* cited by examiner

*Primary Examiner*—Darren Schuberg
*Assistant Examiner*—Derek J Rosenau
(74) *Attorney, Agent, or Firm*—Miles & Stockbridge P.C.

(57) ABSTRACT

The present invention provides a film bulk acoustic wave resonator (FBAR) filter that can keep the Q factor high. The FBAR filter comprises a first FBAR with a first resonant frequency and a second FBAR with a second resonant frequency, formed on a same substrate. The FBAR filter has such a structure that a first underlayer is formed between the substrate and a first bottom electrode layer and a second underlayer is formed between the substrate and a second bottom electrode layer, the first underlayer thickness being different from the second underlayer thickness.

6 Claims, 9 Drawing Sheets

FILM BULK ACOUSTIC WAVE RESONATOR, FILM BULK ACOUSTIC WAVE RESONATOR FILTER AND METHOD OF MANUFACTURING FILM BULK ACOUSTIC WAVE RESONATOR

CROSS-REFERENCE TO RELATED APPLICATION

This application is a division of application Ser. No. 10/909,335 filed Aug. 3, 2004.

CLAIM OF PRIORITY

The present application claims priority from Japanese application serial no. JP 2004-027590 filed on Feb. 4, 2004, the content of which is hereby incorporated by reference into this application.

BACKGROUND OF THE INVENTION

1. Field of the Invention

The present invention relates to film bulk acoustic wave resonator filters employing film bulk acoustic wave resonators (hereinafter referred to as FBARs) and a manufacturing method thereof.

2. Description of the Prior Art

With the proliferation of mobile communication typified by mobile telephony, there is an increasing need for radio frequency filters for several hundred MHz to several GHz. Among many types of filter technologies, a filter that is constructed from FBARs has features of excellence in the following respects: (1) higher frequency operation, (2) smaller construction, (3) temperature characteristics, and (4) high voltage immunity.

A basic FBAR structure is as follows: a piezoelectric layer is sandwiched between a bottom electrode layer and a top electrode layer and an underlayer supports this sandwich over a cavity (for example, refer to non-patent document 1). By applying an electric signal between the two electrodes isolated by the piezoelectric layer, bulk acoustic waves are excited in the piezoelectric layer. At this time, the path of the bulk acoustic waves is a diaphragm structure consisting of the sandwich and the underlayer. Because the top and bottom of the diaphragm structure are acoustically isolated by air, the bulk acoustic waves reflect from the interfaces between the diaphragm structure and the air, which prevents the acoustic energy from leaking out of the diaphragm structure.

To facilitate fabrication of a number of FBARs with different resonant frequencies on a single substrate, the following-improved FBAR structures are known: a structure in which a loading electrode is added to the bottom surface of the bottom electrode layer (for example, refer to patent document 1); a structure in which a loading layer is added to the surface of the piezoelectric layer (for example, refer to patent document 2); and a structure in which a loading electrode is added to the surface of the top electrode layer (for example, refer to patent document 3).

An FBAR filter employing FBARs for a 5 GHz, high-speed wireless LAN has lately been made in pubic (for example, refer to non-patent document 2). In this publication, only a general description is provided as: "designed topology consists of four stages of ladder type filters in which mass loads are applied to shunt resonators only."

[Patent document 1]
JP-A No. 2002-299980

[Patent document 2]
JP-A No. 2002-299979

[Patent document 3]
JP-A No. 2002-335141

[Non-patent document 1]
1994 IEEE International Frequency Control Symposium, pp. 135-138

[Non-patent document 2]
2002 IEEE Ultrasonics Symposium, pp. 969-972

SUMMARY OF THE INVENTION

The FBAR is a device that converts electrical signals input thereto into mechanical vibration and resonates at a frequency that is in inverse proportion to the thickness of its diaphragm structure. Taking advantage of this property, the FBAR can be used as a radio frequency, resonator in electronic circuitry.

To fabricate an FBAR filter, it is necessary to electrically connect two or more FBARs with different resonant frequencies. Although the FBARs with two different resonant frequencies are sufficient for essential filter use, three or more resonators with different resonant frequencies may be required in designing the FBAR filter to accommodate a broader frequency range. To construct a communicating means with both transmitting and receiving functions, such as a mobile phone, a transmit/receive switching device with two filters, namely, a transmitting filter for transmitting frequency and a receiving filter for receiving frequency must be fabricated.

From viewpoints of making device size smaller and cost reduction, FBAR filters are required to be fabricated on a single substrate and, ultimately, fabricating the transmitting and receiving filters on the single substrate is hoped for.

Because the FBAR resonates at a frequency that is one half the wavelength of the total thickness of its diaphragm structure, its resonant frequency is clearly determined from the total thickness of its diaphragm structure, the acoustic velocities of the underlayer material, bottom electrode layer material, piezoelectric layer material, and top electrode layer material. In other words, by changing the total thickness of the diaphragm structure, the resonant frequency of the FBAR can be controlled. To construct the FBAR filter or filters on a single substrate, it is required to change the total thickness of the diaphragm structure for each FBAR.

However, the above-mentioned documents disclose nothing about problems associated with forming a plurality of FBARs with different thicknesses on a single substrate, resonance characteristics, and FBAR structures and fabrication procedures to realize such FBARs without affecting the quality of their main sandwiches.

Because the means provided in the patent documents 1 through 3 are all adding a loading layer to the sandwich that is the main FBAR portion, an additional process is required in forming the sandwich and it affects the FBAR performance.

Specifically, after forming the loading layer, the FBAR device must be removed from vacuum equipment for patterning the loading layer in air environment. Consequently, the loading layer surface is oxidized, which causes deterioration of the resonance characteristics. Because of the additional process of patterning the loading layer, the number of times the device is exposed to a photoresist material, developer, etching liquid or gas, etc. increases. As a result, factors to degrade the film quality of the sandwich significantly increase, which leads to deterioration of the resonance characteristics.

FIG. 12 shows an FBAR equivalent circuit. Here, $R_1$ is loss of the bottom electrode layer, $R_2$ is loss of the piezoelectric layer, and $R_3$ is loss of the top electrode layer. $C_1$, $C_2$ and L are the capacitive and inductive resonance elements, respectively, of the equivalent circuit. With degradation of the film qualities of these layers, $R_1$, $R_2$, and $R_3$ increase. Q factor of the resonator can be expressed by the following equation:

$$Q=\omega_r L/(R_1+R_2+R_3) \quad \text{Equation 1}$$

where, $\omega_r$ is a resonant frequency. From equation 1, it is obvious that an increase in the loss of the layers due to film quality degradation thereof decreases the Q factor of the FBAR.

To construct the FBAR filter, it is required to make a plurality of FBARs resonate at different resonant frequencies and to prevent the factors to decrease the quality, especially, the Q factor of the sandwich that is the main FBAR portion from being introduced during its fabrication.

An object of the present invention is to provide an FBAR filter having a structure that prevents the FBAR performance, especially, the Q factor, from decreasing, and a method of manufacturing the FBAR filter.

By way of illustration, a typical means of the present invention is described below. A film bulk acoustic wave resonator according to the present invention comprises a substrate having a cavity, an underlayer formed on the substrate to cover the cavity, a bottom electrode layer formed on top of the underlayer, a piezoelectric layer formed on top of the bottom electrode layer, and a top electrode layer formed on top of the piezoelectric layer, characterized in that its resonant frequency can be adjusted, depending on the thickness of the underlayer over the cavity.

DETAILED DESCRIPTION OF THE PREFERRED EMBODIMENTS

Preferred embodiments of the present invention will be described hereinafter with reference to the accompanying drawings and through concrete embodiment examples.

Embodiment 1

Figure 1:
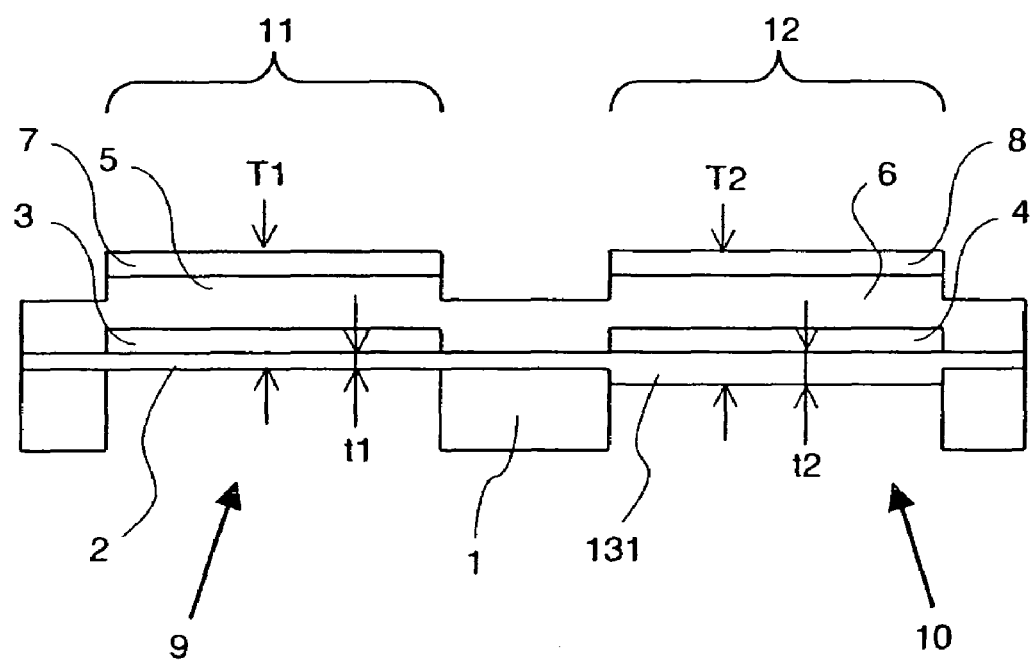
FIG. 1 is a cross sectional diagram of an FBAR device as a first embodiment of the present invention.

FIG. 1 is a cross sectional diagram of an FBAR device which is one example of an of the present invention. In FIG. 1, a region where a first FBAR 11 is formed will be called a first region and a region where a second FBAR 12 is formed will be called a second region. The first and second FBARs have their diaphragm structures which are respectively formed over cavities 9 and 10 formed on the back side of a single substrate. The diaphragm structure in the first region comprises an underlayer 2, bottom electrode layer 3, piezoelectric layer 5, and top electrode layer 7. The diaphragm structure in the second region comprises an underlayer 131, bottom electrode layer 4, piezoelectric layer 6, and top electrode layer 8.

The thickness t2 of the underlayer 131 of the diaphragm structure in the second region is thicker than the thickness t1 of the underlayer 2 of the diaphragm structure in the first region. Therefore, the thickness T2 of the diaphragm structure including the underlayer 131 in the second region is thicker than the thickness T1 of the diaphragm structure including the underlayer 2 in the first region. As a result, the resonant frequency of the second FBAR 12 is lower than the resonant frequency of the first FBAR 11. In this relation, a preferable material of the piezoelectric layers 5 and 6 is aluminum nitride (AlN).

The area of the underlayer 131 over the cavity 10 should be equal to or larger than a section where the bottom electrode layer 4 and the top electrode layer 8 are formed and a complete match between the above area and the above section is not required. This is also true for the first region over the cavity 9.

Although the FBARs with two different resonant frequencies formed on the single substrate are shown in FIG. 1, it is also possible to form FBARs with three or more different resonant frequencies on the single substrate in the same way. For each FBAR, its resonant frequency depends on the diaphragm thickness including the underlayer. In the structure of this embodiment, the underlayer thickness can be changed without affecting the main sandwich structures and, thus, the FBARs with different frequencies can easily be constructed on the same chip.

Figure 2:
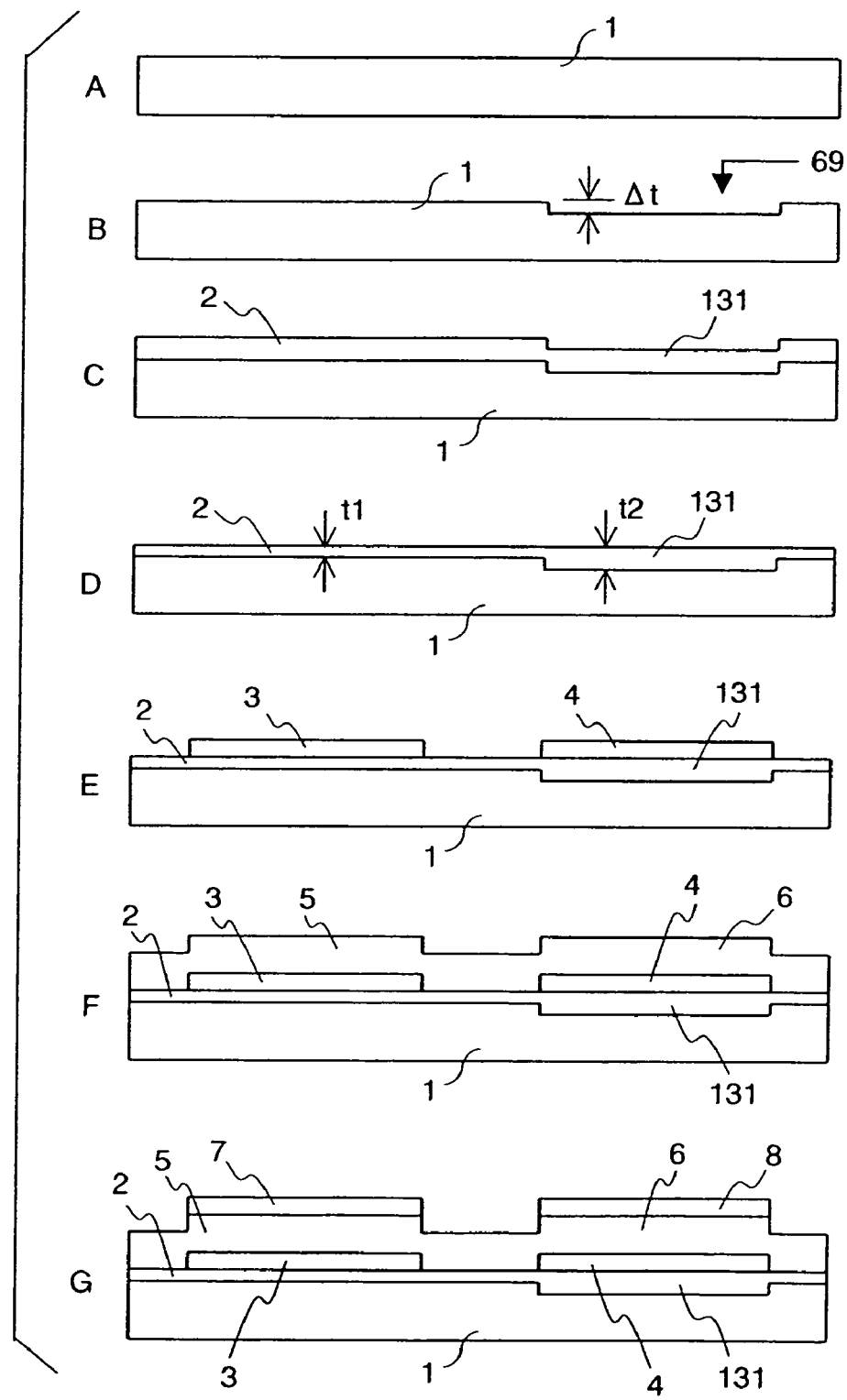
FIG. 2 is a cross sectional diagram set to explain an exemplary procedure of fabricating the FBAR device shown in FIG. 1 in process sequence.

FIG. 2 is a cross sectional diagram set to explain a procedure of fabricating the FBAR structure shown in FIG. 1 in process sequence. Now, it is assumed that the resonant frequencies of the first and second FBARs are f1 and f2 (f1>f2); for instance, f1=1.9 GHz, f2=1.75 GHz. By way of example, a case where AlN is used as the piezoelectric layer material is discussed herein; of course, however, this is not restrictive.

Accordingly, the thickness T1 of the diaphragm structure consisting of the sandwich and underlayer, which resonates at the higher resonant frequency f1 out of the above set resonant frequencies, is 1800 nm, and the thickness of T2 of the diaphragm structure, which resonates at the lower resonant frequency f2, is 1950 nm. To yield a higher resonant frequency, it is advisable to make the thickness of the underlayers 2, 131 thinner or use a material having a property of a higher acoustic velocity for the piezoelectric layers 5, 6.

Then, the FBAR fabrication procedure will be explained below, according to the process diagram set of FIG. 2.

First, form a trench 69 with a depth of Δt (100 nm) on the surface of the substrate 1 in the second region (see diagrams A and B in FIG. 2). The depth Δt corresponds to a difference Δf (Δf=f1−f2) between the resonant frequency of the first FBAR 11 and the resonant frequency of the second FBAR 12.

Next, deposit an underlayer (300 nm thick) over the entire surface of the substrate and form the underlayer 2 in the first region and the underlayer 131 in the second region (see diagram C in FIG. 2).

Next, perform smoothing, for example, with gas cluster ion beam (GCIB), to make the underlayer 2 surface in the first region flush with the underlayer 131 surface in the second region (see diagram D in FIG. 2). This process forms the underlayers 2, 131 having a thickness difference Δt (Δt=t2−t1) which corresponds to Δf.

Next, after depositing a 200-nm thick bottom electrode layer, form the bottom electrode layer 3 on top of the underlayer 2 in the first region by patterning and form the bottom electrode layer 4 on top of the underlayer 131 in the second region by patterning (see diagram E in FIG. 2).

Next, deposit a 1500-nm thick piezoelectric layer and form the piezoelectric layer 5 in the first region and the piezoelectric layer 6 in the second region (see diagram F in FIG. 2).

Next, after depositing a 200-nm thick top electrode layer, form the first top electrode layer 7 on top of the piezoelectric layer 5 in the first region by patterning and form the second top electrode layer 8 on top of the piezoelectric layer 6 in the second region (see diagram G in FIG. 2).

Then, from the back side of the substrate 1, form the cavity 9 in the first region and the cavity 10 in the second region. In this way, the two diaphragm structures with different thicknesses shown in FIG. 1 are constructed.

By fabricating the FBAR device as above, the underlayers with different thicknesses are formed without affecting the main sandwich structures and, consequently, the diaphragm structures with different thicknesses can be achieved. Thus, the FBARs with different resonant frequencies can easily be constructed on the single substrate.

Depositing the bottom and top electrode layers is normally performed by sputtering and the piezoelectric layer can be grown by sputtering or chemical vapor deposition (CVD).

Patterning the layers can be performed by wet or dry etching. The trench 69 can be formed by GCIB; otherwise, it can be formed by using other techniques such as dry etching, wet etching, and ion milling. Smoothing to make the underlayer 2 surface in the first region flush with the underlayer 131 surface in the second region can be performed by chemical mechanical polishing (CMP) besides GCIB. To form the cavities 9 and 10, dry or wet etching can be used.

As the material of the bottom and top electrode layers, preferably, molybdenum (Mo) or tungsten (W) may be used. Because Mo and W are materials of a high acoustic velocity, they have superior acoustic wave transmission properties. Another advantage of Mo and W is that they are easy to process by wet etch patterning. Other materials such as aluminum (Al), tantalum (Ta), nickel (Ni), niobium (Nb), gold (Au), platinum (Pt), copper (Cu), palladium (Pd), titanium (Ti), and alloys thereof can be used as the material of the bottom and top electrode layers.

As the material of the underlayers, preferably, any material may be selected from the following: silicon oxide ($SiO_2$), silicon nitride ($Si_3N_4$), alumina ($Al_2O_3$), AlN, and silicon carbide (SiC). Because the underlayers must support the sandwiches with hollows being under them, it is desirable that they have a high mechanical strength. In this respect, $SiO_2$, $Si_3N_4$, $Al_2O_3$, AlN, and SiC are preferable. Other materials such as zinc oxide (ZnO), lead zirconate titanate (PZT), lead titanate ($PbTiO_3$), and barium titanate ($BaTiO_3$) can be used as the material of the underlayers.

As the material of the piezoelectric layers, besides AlN, ZnO, PZT, $PbTiO_3$, and $BaTiO_3$ can be used. The aforementioned thicknesses of the layers are exemplary and, needless to say, can be designed and changed, as appropriate, according to employed materials and required resonant frequencies. The diaphragm structures of the present FBARs can be fabricated to have thickness in the range of 300 nm to 7 μm in the state of the art of fabrication and this technology is applicable for resonant frequencies of 0.5 GHz to the order of 10 GHz.

Embodiment 2

Figure 3:
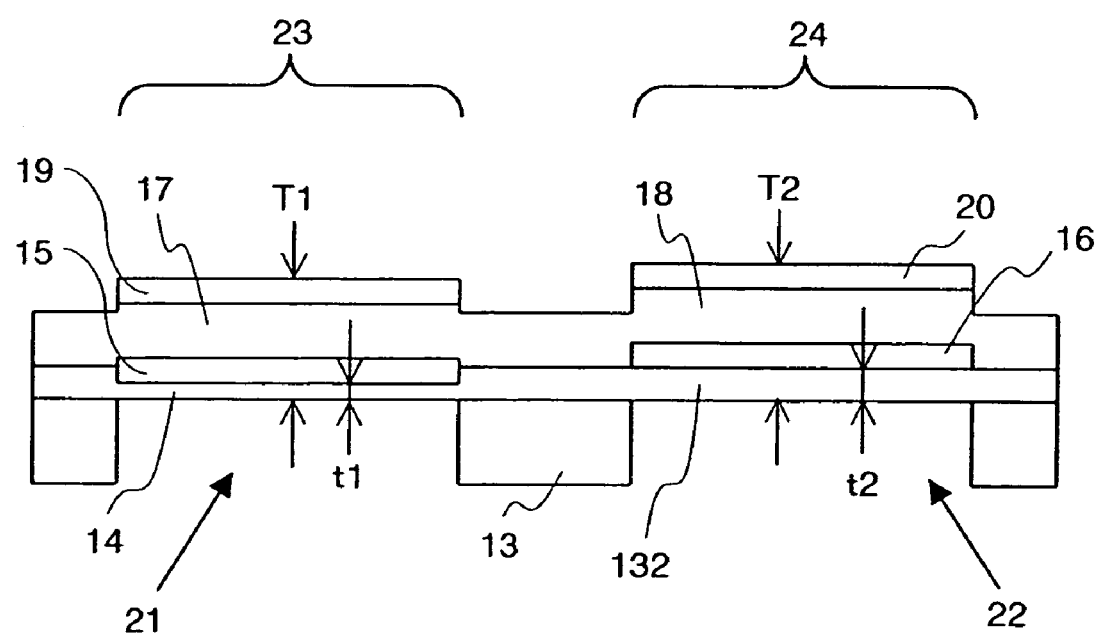
FIG. 3 is a cross sectional diagram of an FBAR device as a second embodiment of the present invention.

FIG. 3 is a cross sectional diagram of an FBAR device which is another example of embodiment of the present invention. In FIG. 3, a region where a first FBAR 23 is formed will be called a first region and a region where a second FBAR 24 is formed will be called a second region. By way of example, the same case as for Embodiment 1 is also discussed herein; that is, the resonant frequencies of the FBARs are 1.9 GHz and 1.75 GHz, respectively, and AlN is used as the piezoelectric layer material. Therefore, the required thickness T1 of the diaphragm structure in the first region and the required thickness T2 of the diaphragm structure in the second region are the same as for Embodiment 1.

In FIG. 3, the first FBAR 23 and second FBAR 24 are formed on the single substrate, on the back side of which cavities 21 and 22 are formed thereunder, respectively. The thickness t1 of the underlayer 14 of the diaphragm structure in the first region is thinner than the thickness t2 of the underlayer of the diaphragm structure in the second region. As a result, the resonant frequency f1 of the first FBAR 23 is higher than the resonant frequency f2 of the second FBAR 24.

The area of the thinner underlayer 14 over the cavity 21 in the first region should be equal to or larger than a section where a bottom electrode layer 15 and top electrode layer 19 are formed in the first region and a complete match between the above area and the above section is not required. This is also true for the second region over the cavity 22.

Figure 4:
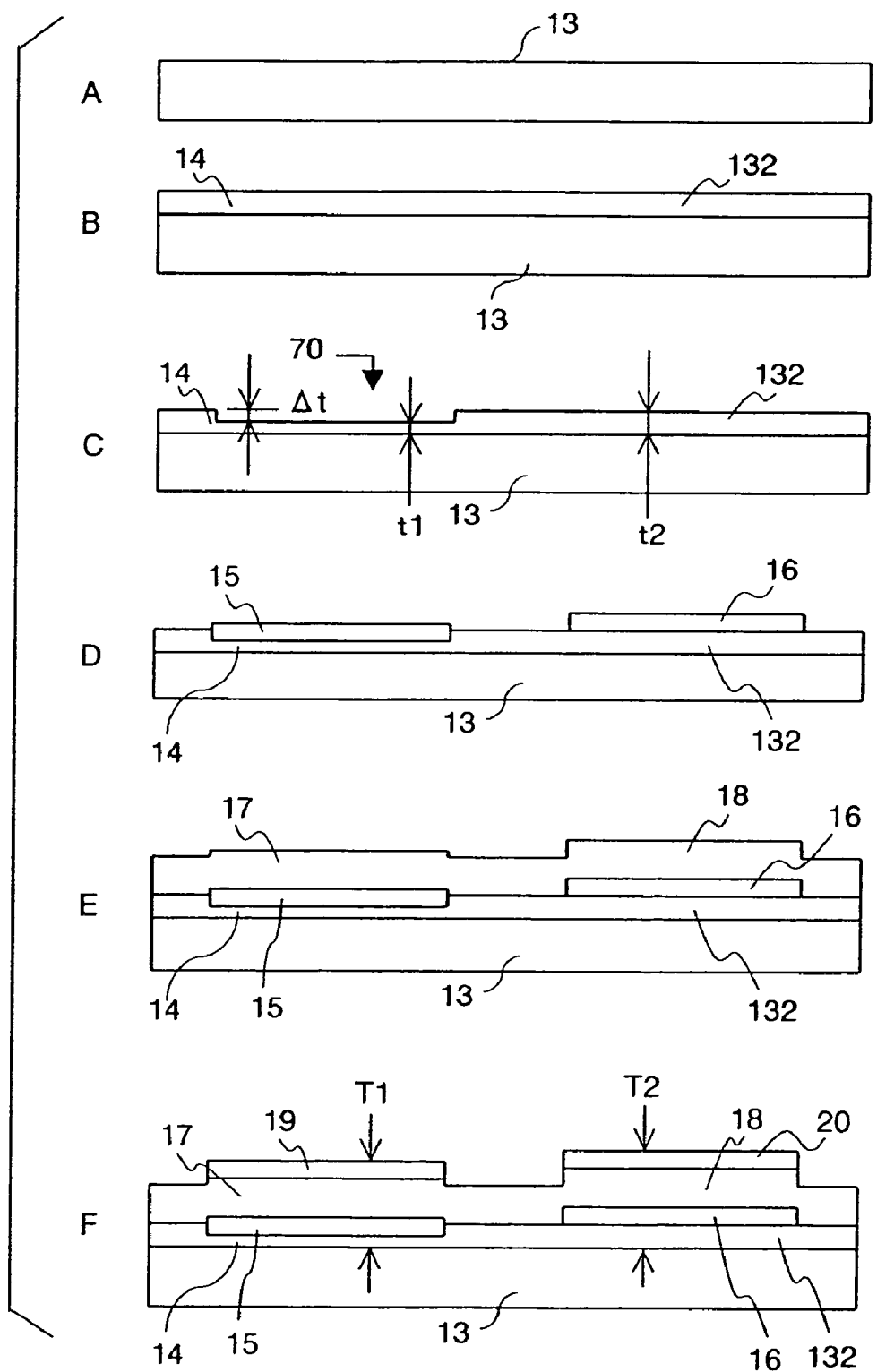
FIG. 4 is a cross sectional diagram set to explain an exemplary procedure of fabricating the FBAR device shown in FIG. 3 in process sequence.

FIG. 4 is a cross sectional diagram set to explain a procedure of fabricating the FBAR structure shown in FIG. 3 in process sequence.

First, deposit a 200-nm thick underlayer over the surface of the substrate (see diagrams A and B in FIG. 4).

Next, form a trench 70 with a depth of Δt (Δt=t2−t1) in the underlayer 14 in the first region (see diagram C in FIG. 4). The depth Δt corresponds to a difference Δf (Δf=f1−f2) between the resonant frequency f1 of the first FBAR 23 and the resonant frequency f2 of the second FBAR 24.

Next, after depositing a bottom electrode layer, form the bottom electrode layer 15 on top of the underlayer 14 in the first region by patterning and form the bottom electrode layer 16 on top of the underlayer 132 in the second region (see diagram D in FIG. 4).

Next, deposit a piezoelectric layer which is on the order of 950 nm thick (see diagram E in FIG. 4).

Next, after depositing a top electrode layer, form the top electrode layer 19 on top of the piezoelectric layer 17 in the first region by patterning and form the top electrode layer 20 on top of the piezoelectric layer 18 in the second region by patterning (see diagram F in FIG. 4).

Then, from the back side of the substrate 13, form the cavity 21 in the first region and the cavity 22 in the second region. In this way, the FBAR structure shown in FIG. 3 is constructed.

The trench 70 can be formed by wet etching, dry etching, ion milling, and GCIB.

The fabrication procedure of Embodiment 2 is advantageous in that it dispenses with smoothing by GCIB and, accordingly, the FBAR device is constructed with a reduced number of processes as compared with Embodiment 1.

The trench 70 in the underlayer can also be formed in the following method: after completely removing the underlayer in the region where the trench is to be formed until the substrate 13 surface is exposed, deposit the underlayer material over the surface again. This method neutralizes the effect of reducing the number of processes. However, its merit is that the underlayer can be formed to a thickness that is more accurate than in the case of forming the trench 70 by trenching.

Embodiment 3

This section describes constructing a filter with FBARs on a single substrate as a third embodiment example of the invention.

Figure 5:
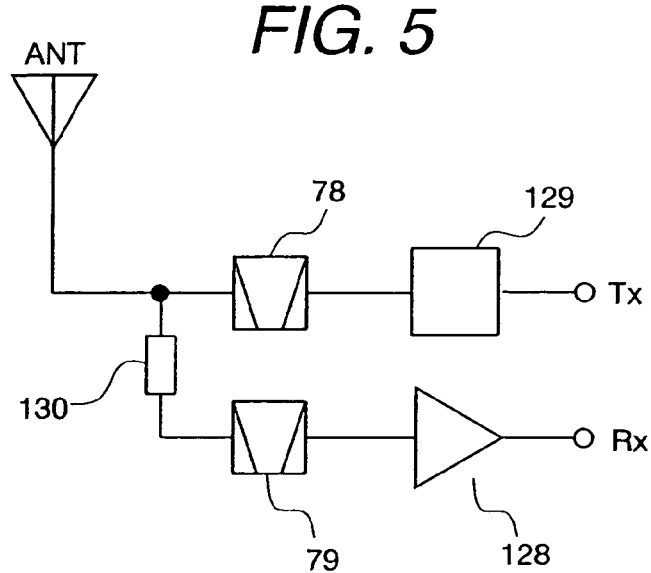
FIG. 5 is a circuit block diagram of a general mobile phone's front end portion.

FIG. 5 is a block diagram of a general mobile phone's front end portion. In FIG. 5, reference numeral 130 denotes a phase shifter which enables an antenna to be shared by a receiving portion and a transmitting portion. Radio frequency (RF) received signals Rx received by the antenna ANT pass through the phase shifter 130 and through a receiving filter 79 which removes image frequency signals and allows only signals falling within a predetermined frequency range of receiving bandwidth and input to a low noise amplifier 128. The RF received signals Rx amplified in the low noise amplifier 128 are passed to the mobile phone's internal circuitry comprising a mixer circuit, an intermediate frequency filter, etc. which are not shown.

On the other hand, RF transmitting frequency signals Tx which have been passed from the mobile phone's internal circuitry not shown are amplified by a power amplifier 129 and pass through a transmitting filter 78 which allows only signals falling within a predetermined frequency range of transmitting bandwidth, and, then, emitted as radio waves from the antenna.

The above transmitting filter 78 and the receiving filter 79 for RF signals, employed in the front end portion, can be constructed by an ensemble of a plurality of FBARs.

In the following, a FBAR filter consisting of a plurality of FBARs as the present embodiment, which is constructed as the transmitting filter 78 and the receiving filter 79, will be explained. By way of example, it is assumed that the transmitting frequency Tx band ranges from 1.85 to 1.91 GHz and the receiving frequency Rx band ranges from 1.93 to 1.99 GHz.

Figure 6:
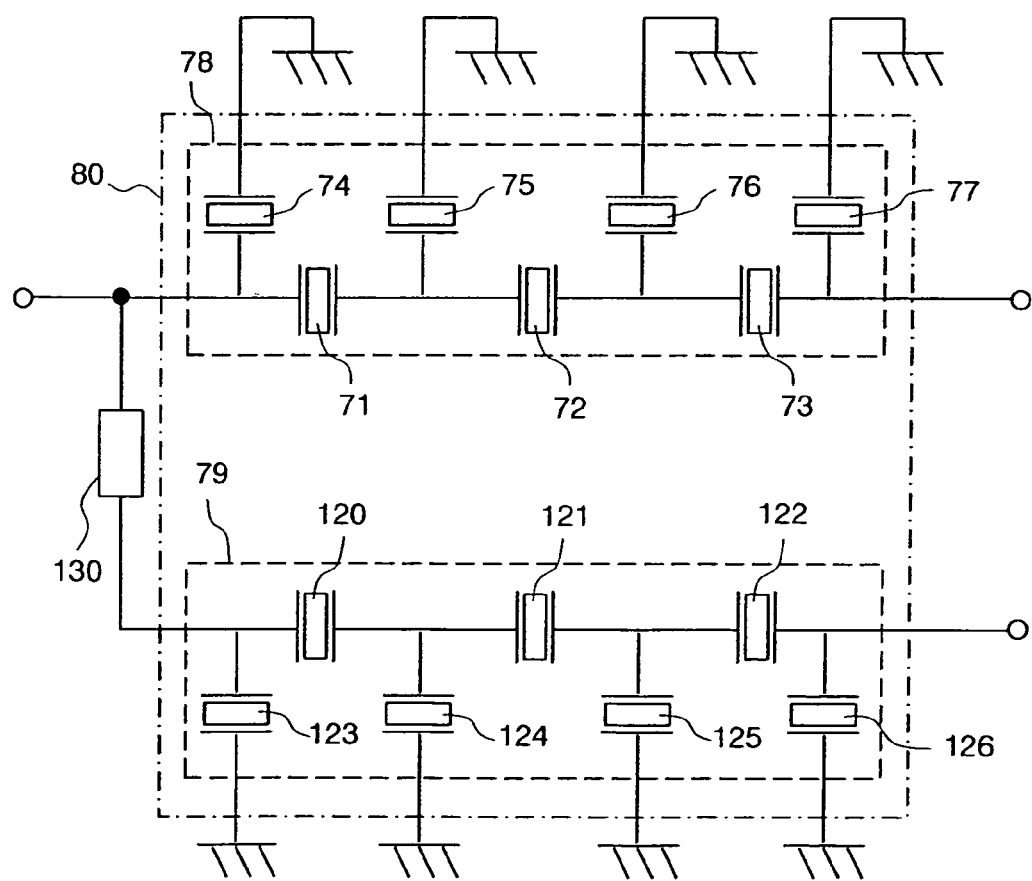
FIG. 6 is a circuit block diagram of a sub-portion comprising a couple of transmitting and receiving filters constructed with an array of FBARs in the front end portion shown in FIG. 5.

FIG. 6 is a circuit block diagram of a sub-portion comprising the phase shifter 130, transmitting filter 78, and receiving filter 79 in the front end portion shown in FIG. 5. The transmitting filter 78 is made up of an array of FBARs 71-77 within an upper block marked off by a dotted line and the receiving filter 79 is made up of an array of FBARs 120-126 within a lower block marked off by a dotted line. For a block 80 marked off by a chain line in FIG. 6, it will be described later in an Embodiment 4 section.

Figure 7:
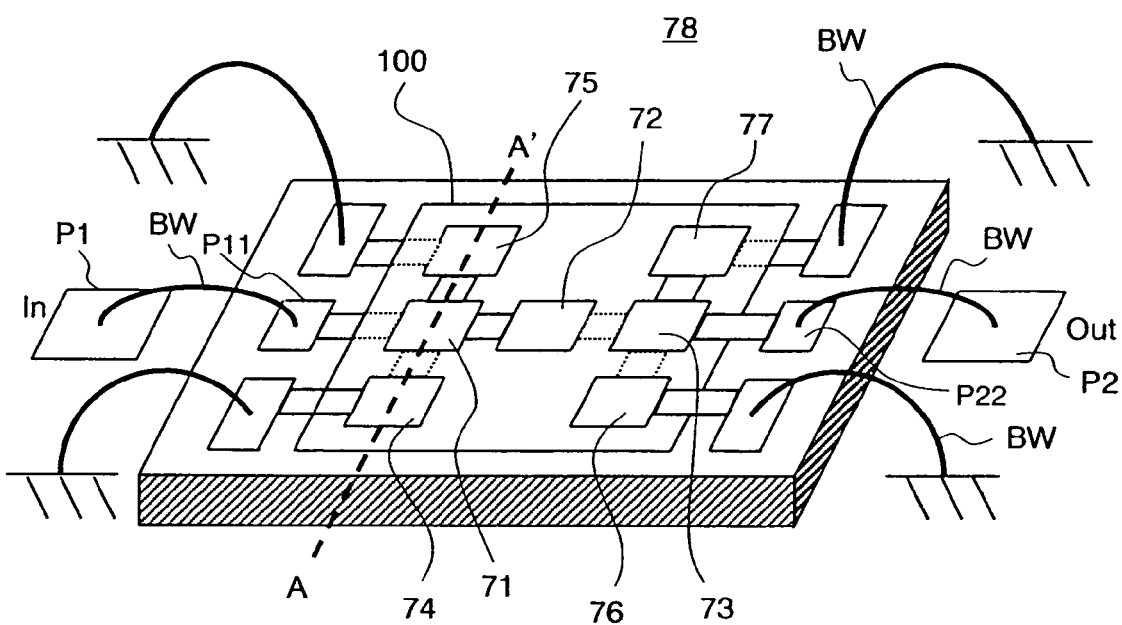
FIG. 7 is an external perspective view schematic of the transmitting filter made up of FBARs of the present invention, fabricated on a single substrate.

By way of example, an external perspective view schematic of the transmitting filter 78 fabricated on a single substrate is shown in FIG. 7. Although quadrangular FBARs 71-77 are shown here, the shape of the FBARs is not limited to quadrangles. The FBARs 71-73 are series resonators and the FBARs 74-77 are shunt resonators. In FIG. 7, solid lines between the FBARs denote wiring leads that connect to the top electrodes of the FBARs and dotted line denote wiring leads that connect to the bottom electrodes of the FBARs. A quadrangular region 100 is a piezoelectric layer.

Reference symbol P1 denotes an input wiring pad to which transmit signals passed from the internal circuitry not shown are input. This input wiring pad is connected to an input pad P11 of the filter, which is connected to an FBAR 71 of the transmitting filter 78, by a bonding wire BW, and further connected via FBARs 72, 73 connected in series by electrode wiring to an output pad P22 of the filter. The output pad P22 of the filter and a pad P2 connected to the antenna which is not shown are connected by a bonding wire BW. Wiring pads connected to the top electrodes of FBARs 74, 76 and wiring pads connected to the bottom electrodes of FBARs 75, 77 are connected to ground pads which are not shown by bonding wires, respectively. In this way, the transmitting filter 78 shown in the circuit diagram of FIG. 6 is formed on the single substrate.

Figure 8:
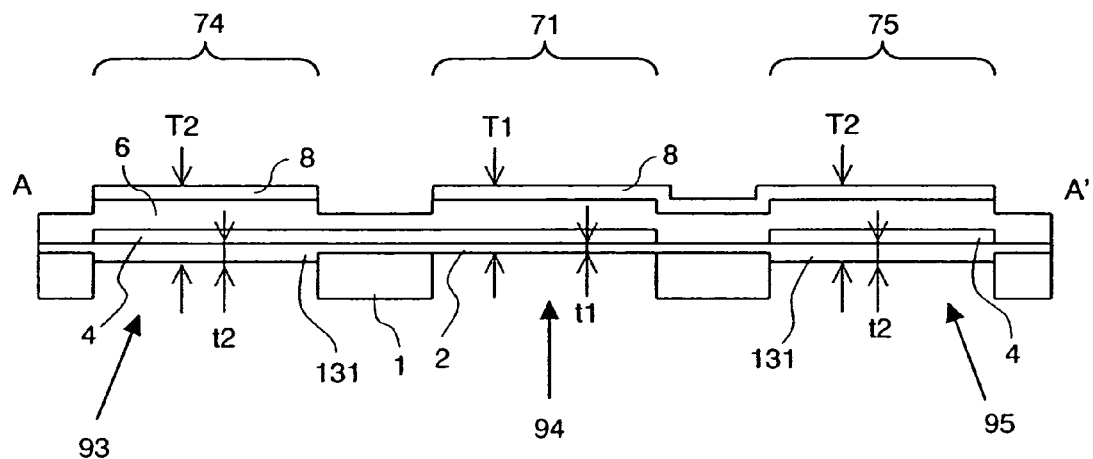
FIG. 8 is a cross sectional view of FBARs as an example of application of the FBAR structure of Embodiment 1.

FIG. 8 is a cross sectional view of the FBARs with regard to the section taken along A-A' line shown in FIG. 7, wherein the FBAR structure of Embodiment 1 is applied to the FBARs. An FBAR 74 formed over cavity 93 is a shunt resonator, FBAR 71 formed over cavity 94 is a series resonator, and an FBAR 75 formed over cavity 95 is a shunt resonator. The underlayers 131 in the regions of the FBARs 74 and 75 are thicker than the underlayer 131 of the FBAR 71. Thus, the resonant frequency of the FBARs 74 and 75 is lower than the resonant frequency of the FBAR 71. For example, the thickness T1 of the diaphragm structure of the FBAR 71 which resonates at 1.9 GHz is 1800 nm and its underlayer thickness t1 is 50 nm. The thickness T2 of the diaphragm structures of the FBARs 74 and 75 which resonate at 1.75 GHz is 1950 nm and their underlayer thickness t2 is 200 nm.

Because the FBARs can be formed without damaging the sandwiches, the FBAR filter employing these FBARs can achieve a high Q factor.

Figure 9:
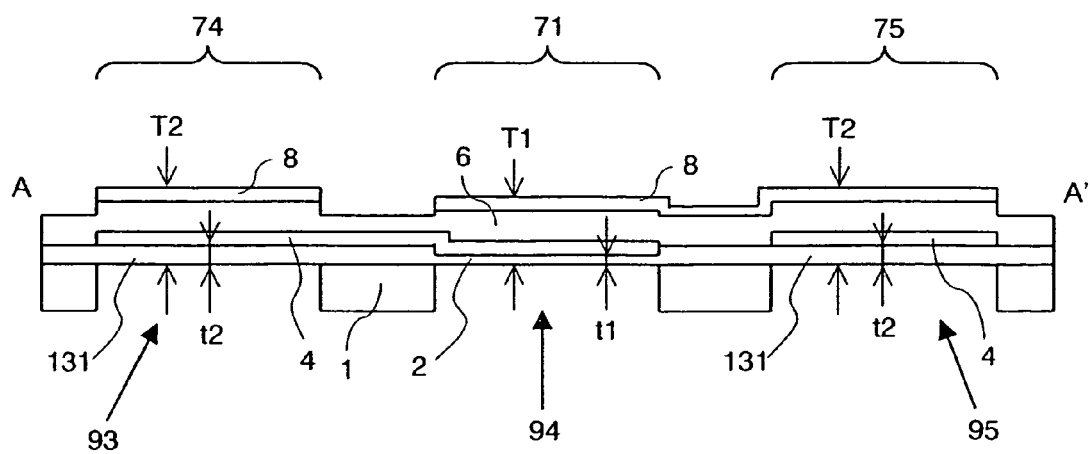
FIG. 9 is a cross sectional view of FBARs as an example of application of the FBAR structure of Embodiment 2.

FIG. 9 is a cross sectional view of the FBARs with regard to the section taken along A-A' line shown in FIG. 7, wherein the FBAR structure of Embodiment 2 is applied to the FBARs.

Components corresponding to those shown in FIG. 8 are assigned the same reference numerals and their detailed explanation is not repeated for convenience of explanation. As is the case in FIG. 8, in FIG. 9 as well, the thickness t2 of the underlayers in the regions of the FBARs 74 and 75 is thicker than the thickness t1 of the underlayer 131 of the FBAR 71. Thus, the resonant frequency of the FBARs 74 and 75 is lower than the resonant frequency of the FBAR 71.

Embodiment 4

Embodiment 4 is an embodiment of the invention in which both transmitting and receiving filters employing FBARs are fabricated on a single substrate. The couple of transmitting and receiving filters included in the front end portion circuitry shown in FIG. 5 are fabricated on the single substrate. Therefore, although the same circuitry as shown in FIG. 6 applies, the couple 80 of the transmitting filter 78 made up of the FBARs 71-77 and the receiving filter 79 made up of the FBARs 120-126 in the block marked off by the chain line in FIG. 6 is formed on the single substrate 1.

Figure 10:
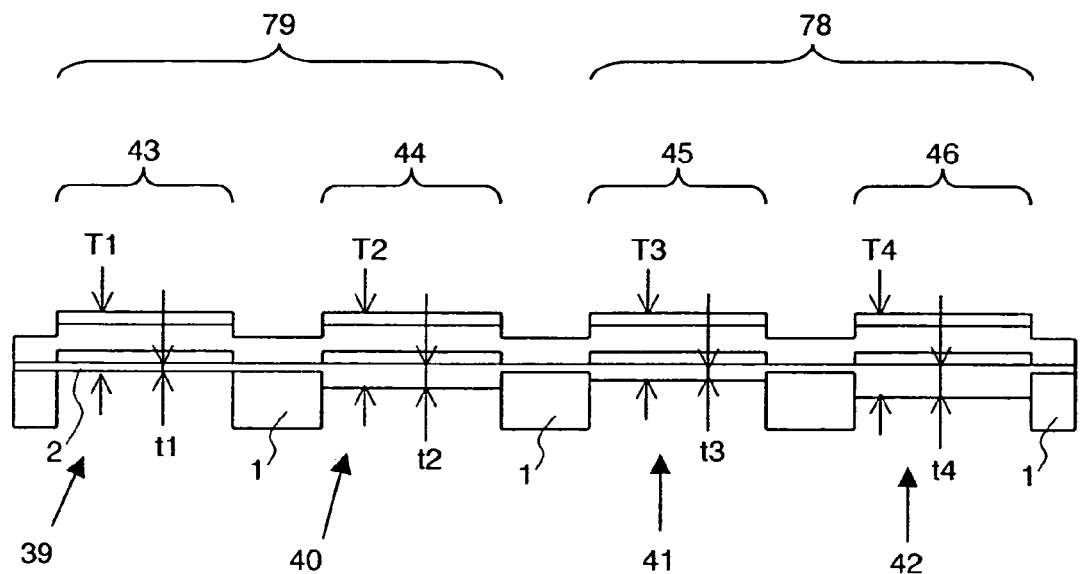
FIG. 10 is a cross sectional view of four FBARs to which the FBAR structure of Embodiment 1 is applied, the four FBARs constituting the couple of transmitting and receiving filters on the single substrate.

To fabricate the couple 80 of the transmitting filter 78 and receiving filter 79 on the single substrate, at least four FBARs that respectively resonate at different frequencies must be fabricated on the single substrate. FIG. 10 shows a fabrication example in which four FBARs with different resonant frequencies are fabricated on a single substrate in accordance with the FBAR structure shown in Embodiment 1. Here, however, the electrode wirings between the FBARs are omitted, and this figure shows a cross sectional view of the four FBARs having different diaphragm structure thicknesses T1, T2, T3, and T4 including different underlayer thicknesses t1, t2, t3, and t4 over the cavities 39, 40, 41, and 42, respectively.

The receiving filter 79 and transmitting filter 78 are formed on the single substrate 1. Each of both filters comprises FBARs of diaphragm structures formed to at least two different thicknesses; that is, referring to FIG. 6, the receiving filter 79 comprises the FBARs 120-122 as series resonators and the FBARs 123-126 as shunt resonators and the transmitting filter 78 comprises the FBARs 71-73 as series resonators and the FBARs 74-77 as shunt resonators. On the assumption that the transmitting frequency Tx ranges from 1.85 to 1.91 GHz and the receiving frequency Rx ranges from 1.93 to 1.99 GHz, for the transmitting filter 78, the diaphragm structures of the FBARs resonating at 1.9 GHz and 1.75 GHz have different thicknesses T3=1800 nm and T4=1950 with different underlayer thicknesses t3=150 nm and t4=300 nm, as described in Embodiment 3.

For the receiving filter, the diaphragm structures of the FBARs resonating at 2 GHz and 1.85 GHz have different thicknesses T1=1700 nm and T2=1850 with different underlayer thicknesses t1=50 nm and t2=200 nm.

Referring to FIG. 10, for example, it is advisable to construct the receiving filter 79 consisting of an FBAR as a series resonator 43 with the diaphragm thickness T1 and an FBAR as a shunt resonator 44 with the diaphragm thickness T2 and the transmitting filter 78 consisting of an FBAR as a series resonator 45 with the diaphragm thickness T3 and an FBAR as a shunt resonator 46 with the diaphragm thickness T4 on the single substrate 1.

To fabricate such four diaphragm structure variants, for example, in the fabrication process diagrams of FIG. 2 for Embodiment 1, after forming the trench 69 in process B, it advisable to add the following process: cover the entire surface with photoresist, perform patterning, and form a trench with a depth corresponding to a difference t4−t3 between the above thicknesses t4 and t3.

Figure 11:
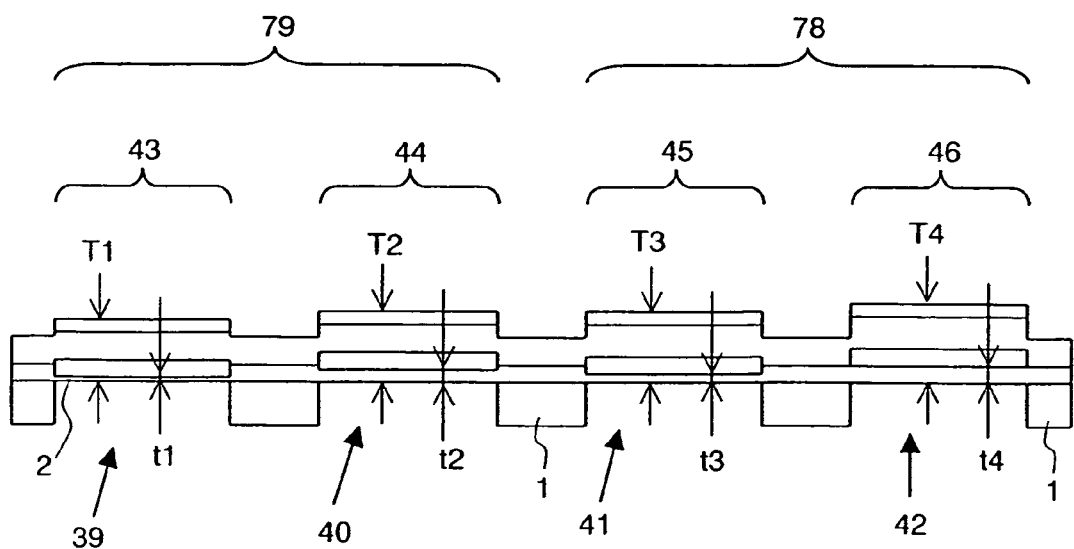
FIG. 11 is a cross sectional view of four FBARs to which the FBAR structure of Embodiment 2 is applied, the four FBARs constituting the couple of transmitting and receiving filters on the single substrate.
Figure 12:
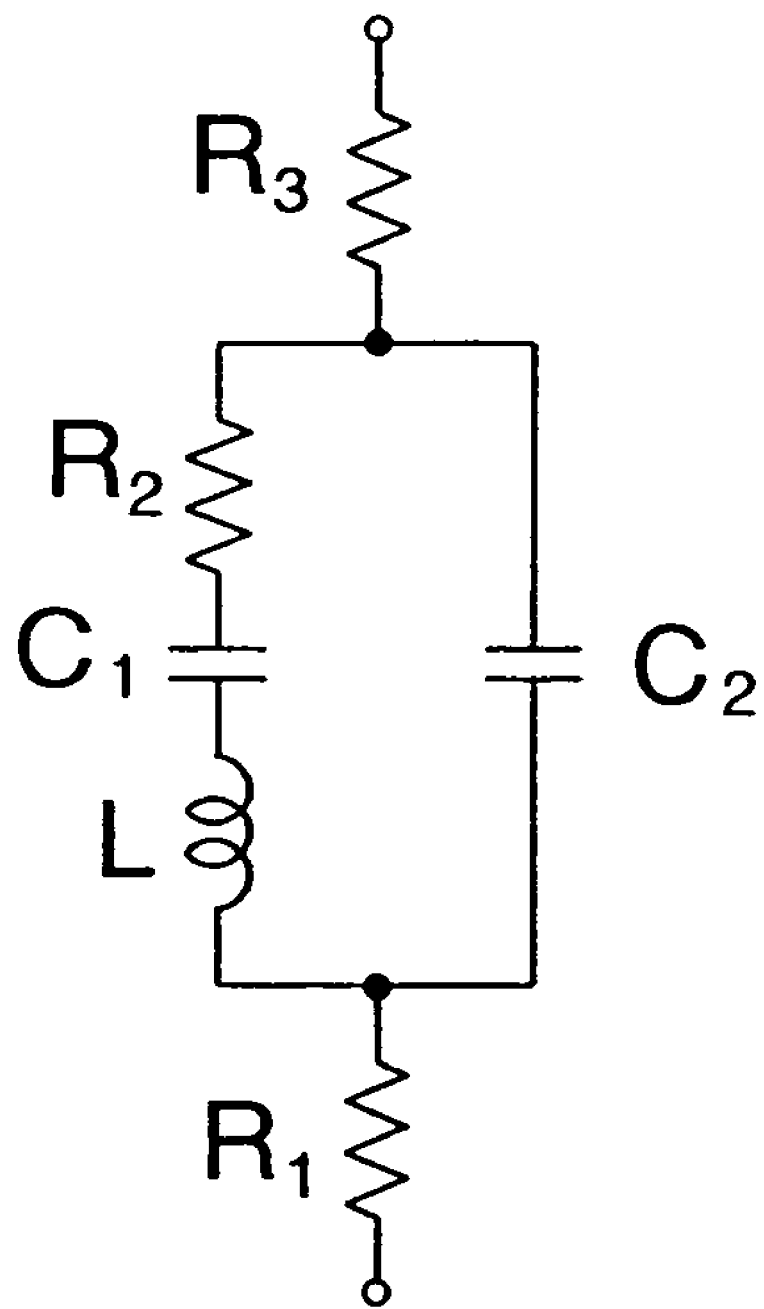
FIG. 12 is an FBAR equivalent circuit diagram.

FIG. 11 shows a fabrication example in which four FBARs with different resonant frequencies are fabricated on the single substrate 1 in accordance with the FBAR structure shown in Embodiment 2. Components corresponding to those shown in FIG. 10 are assigned the same reference numerals and their detailed explanation is not repeated for convenience of explanation. Referring to FIG. 11, it will be appreciated that the four FBARs with different thicknesses can be formed on the single substrate to constitute the receiving filter 79 and transmitting filter 78 in the same way as in the case of FIG. 10. To fabricate this structure, for example, in the fabrication process diagrams of FIG. 4, after depositing the underlayer to the thickness t4 for the FBAR that must resonate at the lowest frequency in process B, the FBARs can be formed by adding a process of patterning by photolithography and dry etching which are repeated to form other underlayers to the required thicknesses t1, t2, and t3 in process C.

For fabricating three or more FBARs with different resonant frequencies on a single substrate, it is needless to say that both the FBAR structures disclosed in Embodiments 1 and 2 may coexist on the substrate.

All FBARs fabricated on the single substrate are made capable of resonating at different frequencies by forming their underlayers to different thicknesses and, thus, there is no need to introduce an additional structure into the main sandwich structures of the FBARs. Therefore, the sandwich fabrication process is easier as compared with the aforementioned conventional structure.

While the present invention has been described in conjunction with its preferred embodiments, it will be appreciated that the present invention is not limited to the illustrative embodiments described hereinbefore and may be embodied in other modified forms without departing from its spirit or essential characteristics.

According to the present invention, sandwich quality degradation which leads to a decrease in FBAR performance, especially, Q factor can be avoided.

What is claimed is:

1. A film bulk acoustic wave resonator filter including a plurality of film bulk acoustic wave resonators comprising:
a substrate having a plurality of cavities;
an underlayer formed on said substrate to cover said cavities;
a bottom electrode layer formed on top of said underlayer;
a piezoelectric layer formed on top of said bottom electrode layer; and
a top electrode layer formed on top of said piezoelectric layer,
wherein the underlayer thickness in a first region where a first resonator of said plurality of resonators is formed differs from the underlayer thickness in a second region where a second resonator of said plurality of resonators is formed,
wherein the underlayer has a top surface and a bottom surface, the bottom electrode layer being formed on the top surface of the underlayer, and
wherein the top surface of the underlayer is planar.

2. A film bulk acoustic wave resonator filter including a plurality of film bulk acoustic wave resonators comprising:
a substrate having a plurality of cavities;
an underlayer formed on said substrate to cover said cavities;
a bottom electrode layer formed on top of said underlayer;
a piezoelectric layer formed on top of said bottom electrode layer; and
a top electrode layer formed on top of said piezoelectric layer,
wherein the underlayer thickness in a first region where a first resonator of said plurality of resonators is formed differs from the underlayer thickness in a second region where a second resonator of said plurality of resonators is formed,
wherein the underlayer has a top surface and a bottom surface, the bottom electrode layer being formed on the top surface of the underlayer, and
wherein a bottom portion of the underlayer in at least one of said first region and said second region extends into a corresponding one of said cavities.

3. A film bulk acoustic wave resonator filter including a plurality of film bulk acoustic wave resonators comprising:
a substrate having a plurality of cavities;
an underlayer formed on said substrate to cover said cavities;
a bottom electrode layer formed on top of said underlayer;
a piezoelectric layer formed on top of said bottom electrode layer; and
a top electrode layer formed on top of said piezoelectric layer,
wherein the underlayer thickness in a first region where a first resonator of said plurality of resonators is formed differs from the underlayer thickness in a second region where a second resonator of said plurality of resonators is formed, wherein the underlayer has a top surface and a bottom surface, the bottom electrode layer being formed on the top surface of the underlayer, a bottom portion of the underlayer in each of the first region and the second region extends into a corresponding one of said cavities, and the bottom portion of the underlayer in the first region extends further into its corresponding cavity than the bottom portion of the underlayer in the second region.

4. A transmitting and receiving filter complex including a plurality of film bulk acoustic wave resonators comprising:

a substrate having a plurality of cavities;

an underlayer formed on said substrate to cover said cavities;

a bottom electrode layer formed on top of said underlayer;

a piezoelectric layer formed on top of said bottom electrode layer; and a top electrode layer formed on top of said piezoelectric layer, wherein said plurality of resonators' resonant frequencies can be adjusted, depending on the thickness of said underlayer over said cavities, wherein a first resonator of said plurality of resonators and a second resonator of said plurality of resonators constitute a transmitting filter and a third resonator of said plurality of resonators and a fourth resonator of said plurality of resonators constitute a receiving filter, and wherein the underlayer thickness in a first region where said first resonator is formed, the underlayer thickness in a second region where said second resonator is formed, the underlayer thickness in a third region where said third resonator is formed, and the underlayer thickness in a fourth region where said fourth resonator is formed differ from one another, wherein the underlayer has a top surface and a bottom surface, the bottom electrode layer being formed on the top surface of the underlayer, and wherein the top surface of the underlayer is planar.

5. A transmitting and receiving filter complex including a plurality of film bulk acoustic wave resonators comprising:

a substrate having a plurality of cavities;

an underlayer formed on said substrate to cover said cavities;

a bottom electrode layer formed on top of said underlayer;

a piezoelectric layer formed on top of said bottom electrode layer; and a top electrode layer formed on top of said piezoelectric layer, wherein said plurality of resonators' resonant frequencies can be adjusted, depending on the thickness of said underlayer over said cavities, wherein a first resonator of said plurality of resonators and a second resonator of said plurality of resonators constitute a transmitting filter and a third resonator of said plurality of resonators and a fourth resonator of said plurality of resonators constitute a receiving filter, and wherein the underlayer thickness in a first region where said first resonator is formed, the underlayer thickness in a second region where said second resonator is formed, the underlayer thickness in a third region where said third resonator is formed, and the underlayer thickness in a fourth region where said fourth resonator is formed differ from one another, wherein the underlayer has a top surface and a bottom surface, the bottom electrode layer being formed on the top surface of the underlayer, and wherein a bottom portion of the underlayer in at least one of said first to fourth regions extends into a corresponding one of said cavities.

6. A transmitting and receiving filter complex including a plurality of film bulk acoustic wave resonators comprising:

a substrate having a plurality of cavities;

an underlayer formed on said substrate to cover said cavities;

a bottom electrode layer formed on top of said underlayer;

a piezoelectric layer formed on top of said bottom electrode layer; and a top electrode layer formed on top of said piezoelectric layer, wherein said plurality of resonators' resonant frequencies can be adjusted, depending on the thickness of said underlayer over said cavities, wherein a first resonator of said plurality of resonators and a second resonator of said plurality of resonators constitute a transmitting filter and a third resonator of said plurality of resonators and a fourth resonator of said plurality of resonators constitute a receiving filter, and wherein the underlayer thickness in a first region where said first resonator is formed, the underlayer thickness in a second region where said second resonator is formed, the underlayer thickness in a third region where said third resonator is formed, and the underlayer thickness in a fourth region where said fourth resonator is formed differ from one another, wherein the underlayer has a top surface and a bottom surface, the bottom electrode layer being formed on the top surface of the underlayer, a bottom portion of the underlayer in each of a plurality of the first to fourth regions extends into a corresponding one of said cavities, and wherein the bottom portion of the underlayer in one of the plurality of regions extends further into its corresponding cavity than the bottom portion of another of the plurality of regions.

* * * * *